(12) United States Patent
Huang

(10) Patent No.: US 9,855,629 B2
(45) Date of Patent: Jan. 2, 2018

(54) HEAT SINK, METHOD FOR MAKING THE SAME, AND ELECTRONIC DEVICE HAVING THE SAME

(71) Applicants: HongQiSheng Precision Electronics (QinHuangDao) Co.,Ltd., Qinhuangdao (CN); FuKui Precision Component (Shenzhen) Co., Ltd., Shenzhen (CN); Zhen Ding Technology Co., Ltd., Tayuan, Taoyuan (TW)

(72) Inventor: Yu-Cheng Huang, New Taipei (TW)

(73) Assignees: Qi Ding Technology Qinhuangdao Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 170 days.

(21) Appl. No.: 14/834,673

(22) Filed: Aug. 25, 2015

(65) Prior Publication Data

US 2016/0381833 A1 Dec. 29, 2016

(30) Foreign Application Priority Data

Jun. 24, 2015 (CN) .......................... 2015 1 0351996

(51) Int. Cl.
    *B23P 15/26* (2006.01)
    *H01L 23/427* (2006.01)
    *H01L 21/48* (2006.01)

(52) U.S. Cl.
    CPC .......... *B23P 15/26* (2013.01); *H01L 21/4882* (2013.01); *H01L 23/427* (2013.01); *B23P 2700/10* (2013.01)

(58) Field of Classification Search
    CPC ..... B23P 15/26; B23P 2700/10; H01L 23/427
    See application file for complete search history.

(56) References Cited

U.S. PATENT DOCUMENTS

2015/0285564 A1* 10/2015 Wood ...................... B23P 15/26
    165/10
2016/0209133 A1* 7/2016 Hu .......................... B32B 37/06

FOREIGN PATENT DOCUMENTS

TW      201442609 A      11/2014

* cited by examiner

*Primary Examiner* — Moshe Wilensky
(74) *Attorney, Agent, or Firm* — ScienBiziP, P.C.

(57) ABSTRACT

A heat sink includes a connecting member, a first substrate, a second substrate, and a cooling medium. The connecting member is sandwiched between the first substrate and the second substrate, and defines at least one hole passing through the connecting member. Each hole includes a first end and a second end respectively enclosed by the first substrate and the second substrate to define a cavity. The cooling medium is filled in each cavity.

7 Claims, 13 Drawing Sheets

HEAT SINK, METHOD FOR MAKING THE SAME, AND ELECTRONIC DEVICE HAVING THE SAME

FIELD

The subject matter herein generally relates to a heat sink, a method for making the heat sink, and an electronic device having the heat sink.

BACKGROUND

Heat sinks are usually used in electronic devices for dissipating heat generated by electronic elements of the electronic devices. Such a heat sink may include two pieces of copper foil. Each piece of copper foil includes a surface defining at least one groove. Two surfaces of the two pieces of copper foil are secured to each other, to cause the at least one groove to define at least one cavity for receiving a cooling medium.

BRIEF DESCRIPTION OF THE DRAWINGS

Implementations of the present technology will now be described, by way of example only, with reference to the attached figures.

DETAILED DESCRIPTION

Figure 1:
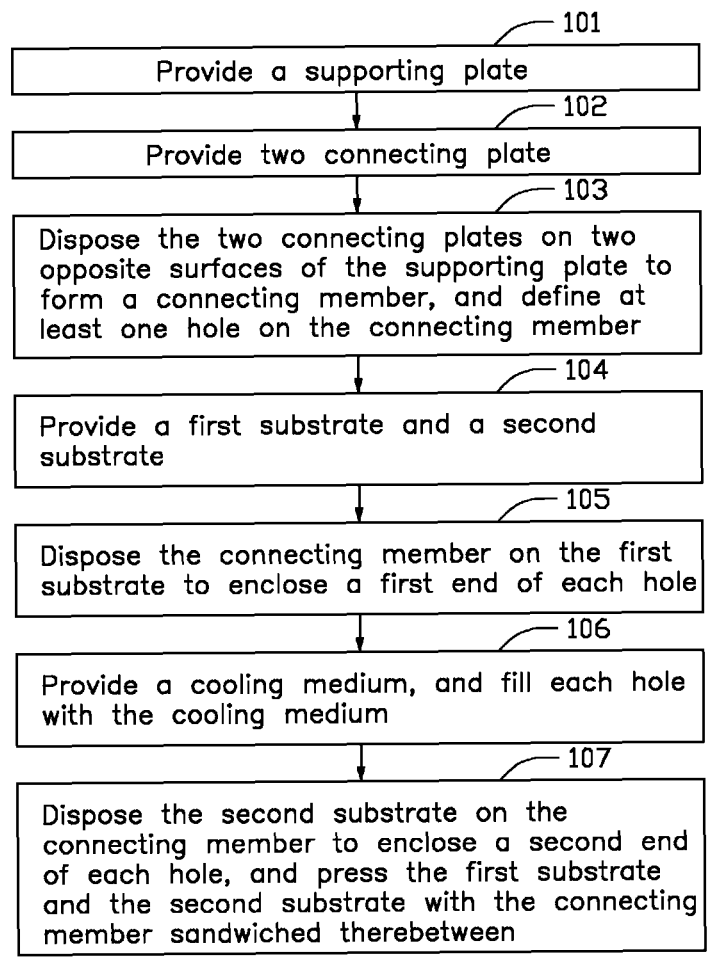
FIG. 1 is a flowchart of an embodiment of a method for making a heat sink.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates a flowchart is presented in accordance with an exemplary embodiment. The exemplary method for making a heat sink 100 (shown in FIG. 8) is provided by way of example, as there are a variety of ways to carry out the method. Each block shown in FIG. 1 represents one or more processes, methods or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 101.

Figure 2:
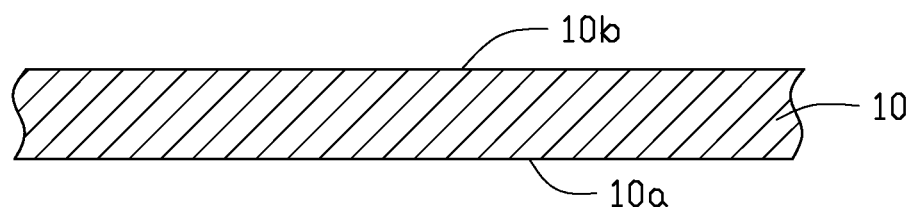
FIG. 2 is a diagrammatic view of a supporting plate used in the method of FIG. 1.

At block 101, a supporting plate 10 (shown in FIG. 2) is provided. In a first embodiment, the supporting plate 10 is made of copper. In other embodiments, the supporting plate 10 may be made of other materials such as aluminum, carbon steel, or silver. A thickness of the supporting plate 10 can be selected according to need.

Figure 3:
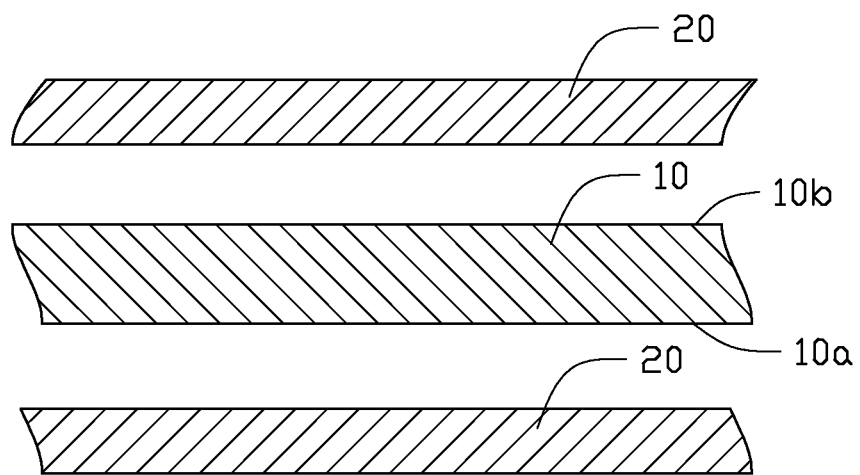
FIG. 3 is a diagrammatic view showing two connecting plates being disposed on the supporting plate of FIG. 2 to form a connecting member.

At block 102, two connecting plates 20 (shown in FIG. 3) are provided. In the first embodiment, each connecting plate 20 is a prepreg consisting of resin and reinforcement material. The reinforcement material may be selected from a group consisting of glass fiber fabric, paper-base, and composite material. In the first embodiment, the resin is epoxy resin, and the reinforcement material is glass fiber fabric. The prepreg is semi-cured material formed by heat treating. The prepreg is softened under heat and pressure, and solidified after being cooled. Each connecting plate 20 has a thickness of about 60 μm to about 100 μm. In other embodiments, the thickness of each connecting plate 20 may be varied, and the thicknesses of the two connecting plates 20 may be different from each other.

Figure 4:
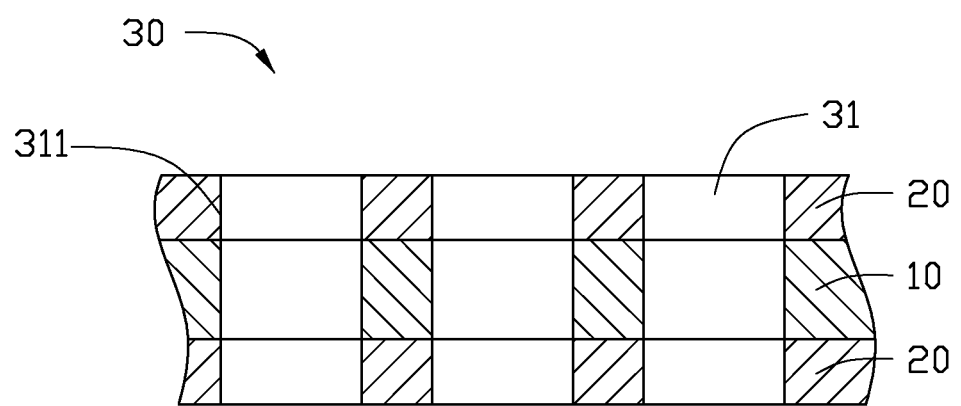
FIG. 4 is a diagrammatic view showing at least one hole being defined in the connecting member of FIG. 3.
Figure 9:
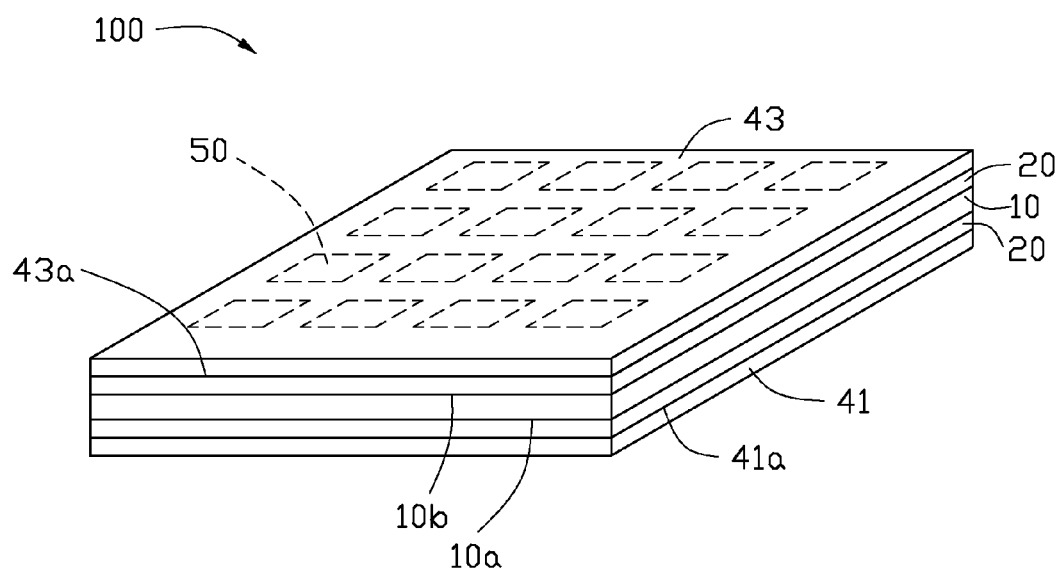
FIG. 9 is similar to FIG. 8, but showing the heat sink from another angle.
Figure 10:
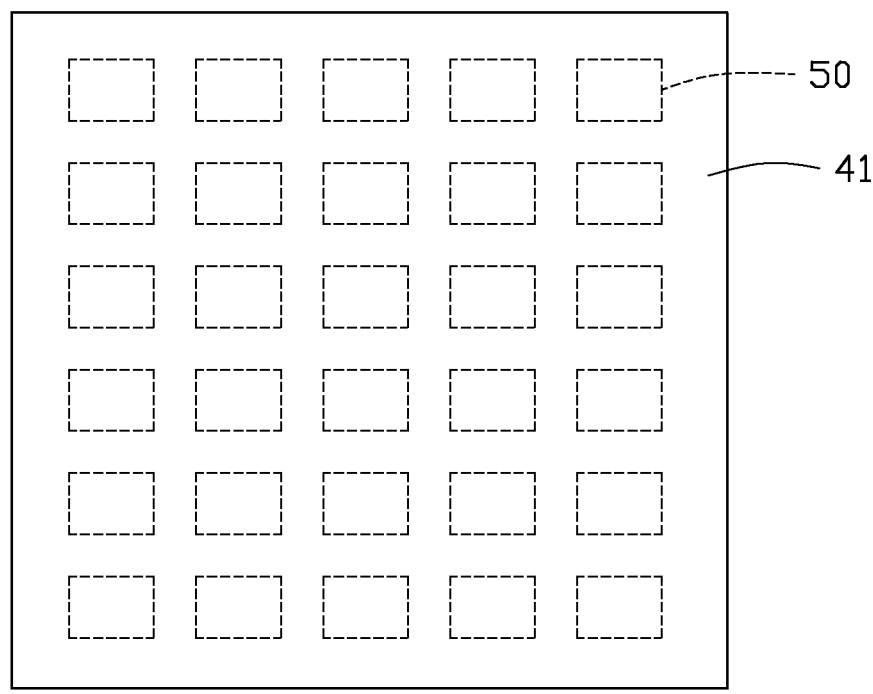
FIG. 10 is similar to FIG. 8, but showing the heat sink from yet another angle.

At block 103, the two connecting plates 20 are respectively disposed on two opposite surfaces 10a and 10b (shown in FIG. 4) of the supporting plate 10 to form a connecting member 30 (shown in FIG. 4). At least one hole 31 (shown in FIG. 4) passing through the two connecting plates 20 and the supporting plate 10 is defined in the connecting member 30. Each hole 31 is defined by mechanical cutting, layer cutting, or punching. During the cutting or punching process, a temperature around an interior wall 311 (shown in FIG. 4) of each hole 31 increases. As such, a portion of each connecting plate 20 adjacent to the interior wall 311 is softened and adheres to the supporting plate 10, thereby preventing each connecting plate 20 from moving relative to the supporting plate 10. In the first embodiment, each hole 31 is substantially square in cross section (FIGS. 9 and 10). In other embodiments, each hole 31 may be substantially circular, rectangular, polygonal, or trapezoidal in cross section. A size of each hole 31 may be varied according to need.

Figure 5:
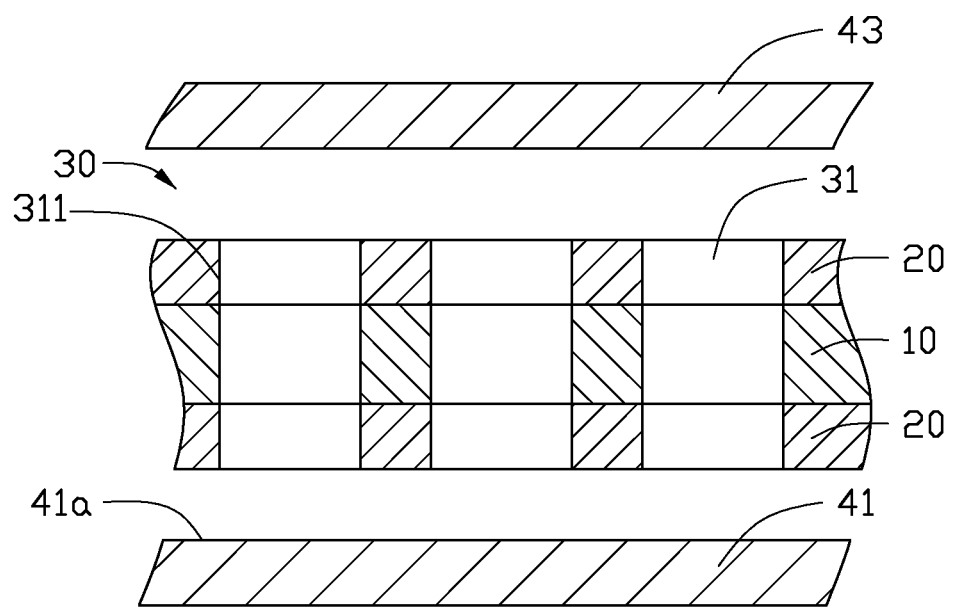
FIG. 5 a diagrammatic view showing a first substrate and a second substrate being disposed on the connecting member of FIG. 4.

At block 104, a first substrate 41 (shown in FIG. 5) and a second substrate 43 (shown in FIG. 5) are provided. In the first embodiment, the first substrate 41 and the second substrate 43 are made of copper foil. Each of the first substrate 41 and the second substrate 43 has a thickness of about 36 µm to about 72 µm. A width of each of the first substrate 41 and the second substrate 43 is substantially identical to a width of the supporting plate 10. In other embodiments, the first substrate 41 and the second substrate 43 may be made of other materials having an excellent heat-conducting capability such as aluminum, silver, or graphite. The material of the first substrate 41 and the material of the second substrate 43 may be different from each other. The thickness of the first substrate 41 or the second substrate 43 may be varied. The thickness of the first substrate 41 and the thickness of the second substrate 43 may be different from each other.

Figure 6:
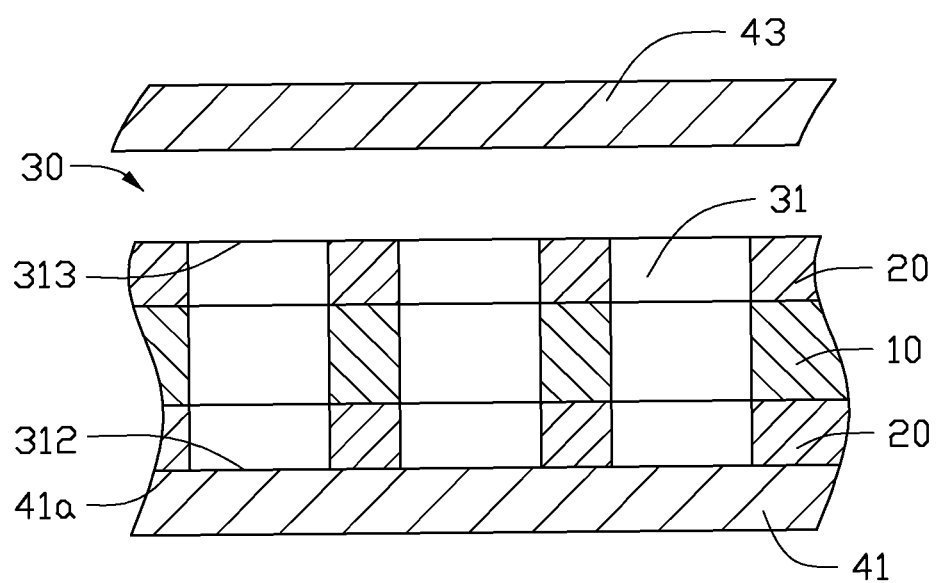
FIG. 6 a diagrammatic view showing one end of each hole being enclosed by the first substrate of FIG. 5.

At block 105, the connecting member 30 is disposed on a surface 41a (shown in FIG. 6) of the first substrate 41, thereby causing one connecting plate 20 of the connecting member 30 to be in direct contact with the surface 41a, and a first end 312 (shown in FIG. 6) of each hole 31 of the connecting member 30 to be enclosed by the first substrate 41.

Figure 7:
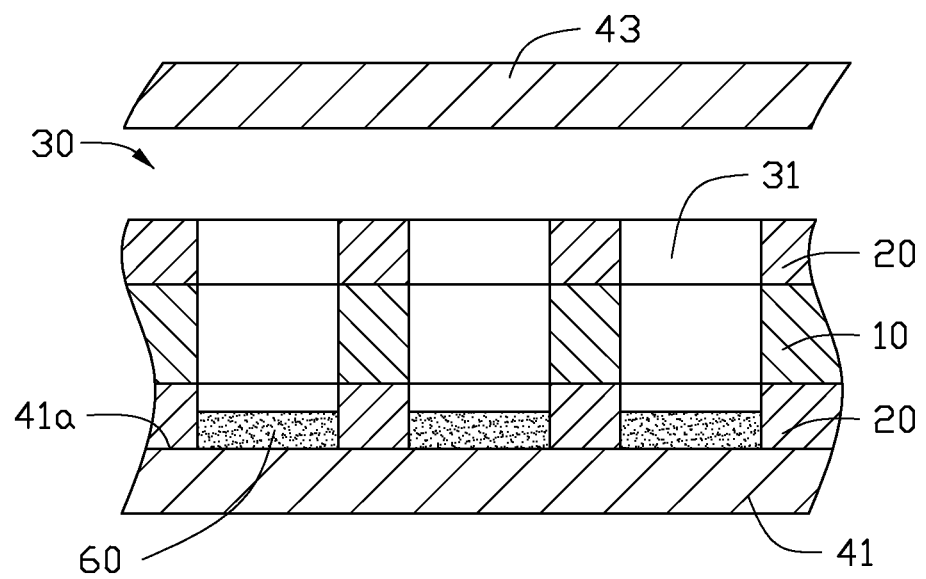
FIG. 7 is a diagrammatic view showing a cooling medium being filled in each hole of FIG. 6.

At block 106, a cooling medium 60 (shown in FIG. 7) is provided, and is filled in each hole 31 by printing, coating or injecting for example. The cooling medium 60 is made of a phase change material (PCM), or a material which can undergo a chemical reaction under heat and generate the phase change material. The cooling medium 60 has a volume percentage of about 15% to about 30% in each hole 31. In this embodiment, the cooling medium 60 is filled in each hole 31 by printing. The cooling medium 60 has a weak fluidity at a normal temperature, thereby preventing the cooling medium 60 from overflowing from each hole 31. As such, the cooling medium 60 can be easily printed into each hole 31.

At block 107, the second substrate 43 is disposed on a surface of the connecting member 30 away from the first substrate 41, to cause the connecting member 30 to be sandwiched between the first substrate 41 and the second substrate 43. Then, the first substrate 41 and the second substrate 43, with the sandwiched connecting member 30 are pressed causing the first substrate 41, the second substrate 43, and the connecting member 30 to be connected to each other and form a heat sink 100. A second end 313 (shown in FIG. 8) of each hole 31 opposite to the first end 312 is enclosed by the second substrate 43 to define an isolated cavity 50 between the first substrate 41 and the second substrate 43. That in the first embodiment, a surface 43a (shown in FIG. 9) of the second substrate 43 is in direct contact with another connecting plate 20. The first substrate 41 and the second substrate 43, with the sandwiched connecting member 30 are pressed under heat and pressure. Then, each of the two connecting plates 20 is softened to become an adhesive, which adheres the first substrate 41 or the second substrate 43 to the supporting plate 10. Then, the two connecting plates 20 are solidified after being cooled, to cause the supporting plate 10, the two connecting plates 20, the first substrate 41, and the second substrate 43 to be connected to each other.

In the first embodiment, the first substrate 41, and the second substrate 43, with the sandwiched connecting member 30 are pressed successively for a number of stages. During different stages, the first substrate 41 and the second substrate 43, with the sandwiched connecting member 30 are pressed for different time periods, and under different temperatures and different pressures. A total time period of the time periods of all the stages is of 225 minute. Table 1 illustrates a relationship between the temperatures, the pressures, and the time periods during different stages of pressing.

TABLE 1

|  | Stages of pressing | | | | | |
|---|---|---|---|---|---|---|
|  | 1 | 2 | 3 | 4 | 5 | 6 |
| Temperature of the pressing (degree) | 30 | 130 | 225 | 225 | 30 | 30 |
| Pressure of the pressing (kg/cm$^2$) | 5 | 5 | 5 | 25 | 25 | 5 |
| Time period (min) | 5 | 41 | 3 | 134 | 44 | 1 |

In a second embodiment, unlike the first embodiment, the surface 10a and the surface 10b of the supporting plate 10 are further roughened at block 101 by chemical etching or mechanical grinding for example.

In a third embodiment, unlike the first embodiment, the surface 41a of the first substrate 41 and the surface 43a of the second substrate 43 are further roughened at block 104 by chemical etching or mechanical grinding for example.

In a fourth embodiment, unlike the first embodiment, the surface 10a and the surface 10b of the supporting plate 10 are further roughened at block 101. The surface 41a of the first substrate 41 and the surface 43a of the second substrate 43 are further roughened at block 104 by chemical etching or mechanical grinding for example.

In a fifth embodiment, unlike the first embodiment, when at least two cavities 50 are defined between the first substrate 41 and the second substrate 43, block 107 of the method can be further followed by cutting the heat sink 100 to obtain at least two cooling units each including at least one cavity 50. The number of the cooling units may be varied, for example, according to a size of the electronic element which needs to dissipate heat.

Figure 8:
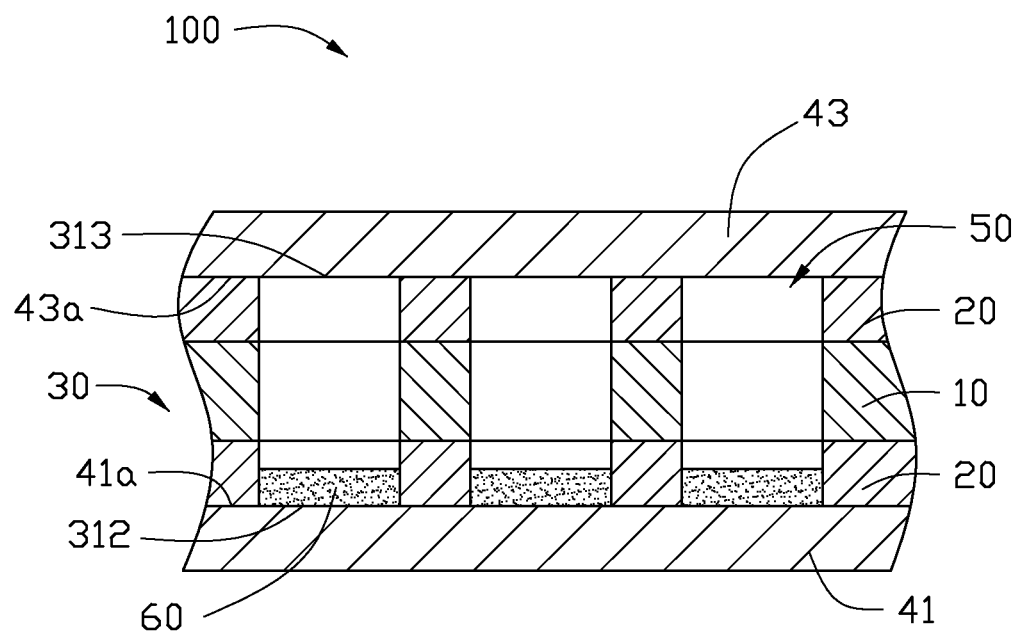
FIG. 8 is a diagrammatic view showing each hole with the cooling medium being enclosed by the second substrate of FIG. 5 to form a heat sink.

FIG. 8 illustrates that in the first embodiment, the heat sink 100 includes a connecting member 30, a first substrate 41, a second substrate 43, and a cooling medium 60. The first substrate 41 and the second substrate 43 are connected to two opposite surfaces of the connecting member 30. The connecting member 30 defines at least one hole 31 passing through the connecting member 30. The first end 311 and the opposite second end 313 of each hole 31 are respectively enclosed by the first substrate 41 and the second substrate 43 to define a cavity 50. The cooling medium 60 is filled in each cavity 50.

FIG. 9 illustrates that the first substrate 41 (further shown in FIG. 10) includes a surface 41a connected to the connecting member 30. The second substrate 43 includes a surface 43a connected to the connecting member 30. The connecting member 30 includes a supporting plate 10 and two connecting plates 20. The supporting plate 10 includes two opposite surfaces 10a and 10b. One connecting plate 20 is connected between the surface 10a and the surface 41a. The other connecting plate 20 is connected between the surface 10b and the surface 43a.

In other embodiments, the surfaces 10a and 10b of the supporting plate 10, the surface 41a of the first substrate 41, and the surface 43a of the second substrate 43 can be roughened.

Figure 11:
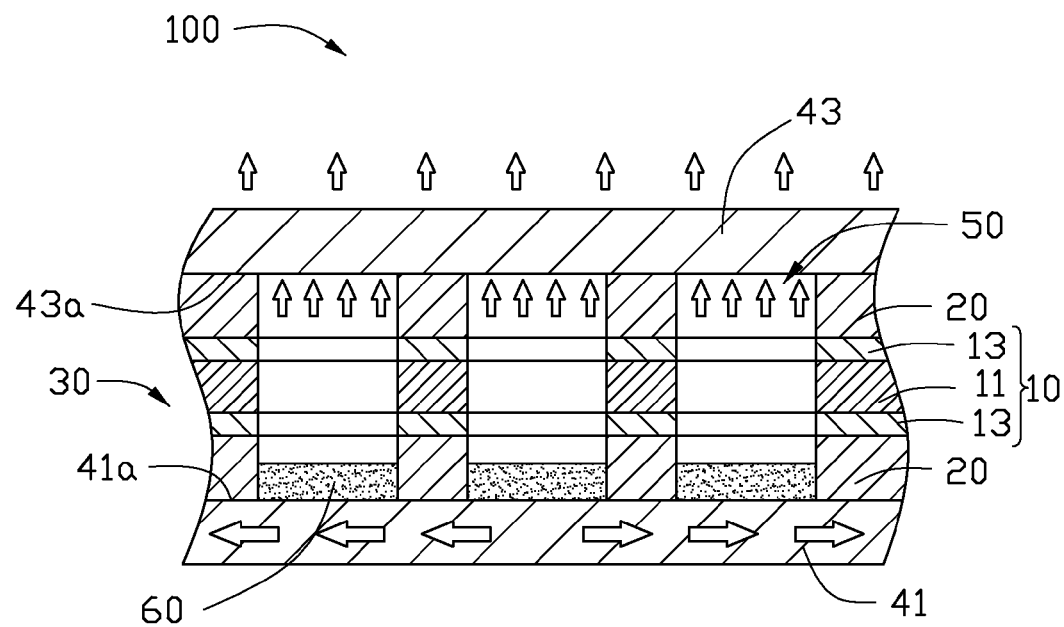
FIG. 11 is similar to FIG. 8, but showing the heat sink in another embodiment.

FIG. 11 illustrates that in other embodiments, unlike the first embodiment, the supporting plate 10 includes a supporting sheet 11 and two copper sheets 13 formed on two opposite surfaces of the supporting sheet 11. The supporting plate 10 has a thickness of about 100 μm. The supporting sheet 11 is made of an insulating material. The two connecting plates 20 are respectively disposed on the two copper sheets 13 to form the connecting member 30. The copper sheet 13 can be replaced by an aluminum sheet or a silver sheet. The thickness of the supporting plate 10 may be varied.

Figure 12:
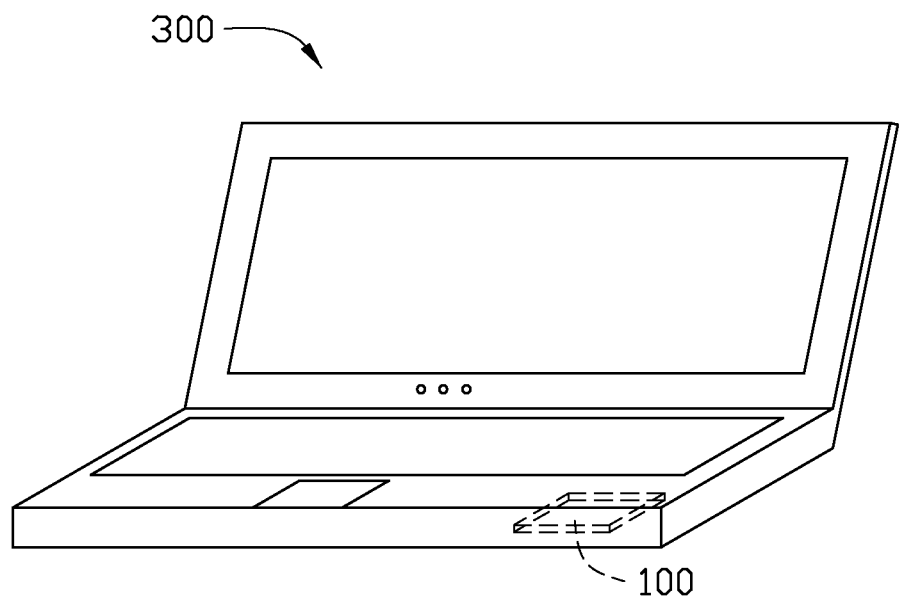
FIG. 12 is an isometric view of an embodiment of an electronic device including the heat sink of FIG. 8.

FIG. 12 illustrates an electronic device 300 including a number of electronic elements (not shown) and at least one heat sink 100. The electronic device 300 can be a cell phone, a tablet computer, or a media player. The electronic element may be a central processing unit (CPU), a hard disk, or a memory.

Figure 13:
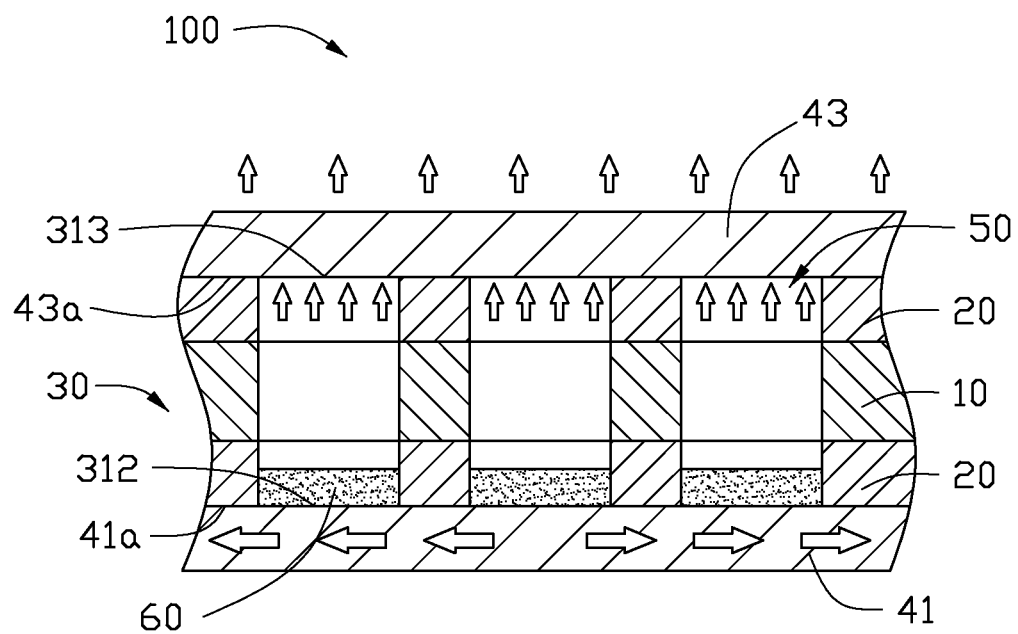
FIG. 13 is an isometric view showing the heat sink of FIG. 8 in a working state.

When in use, the first substrate 41 is in contact with the electronic element which needs to dissipate heat. FIG. 13 illustrates that the cooling medium 60 absorbs the heat generated by the electronic element via the first substrate 41, and undergoes a phase change to conduct the absorbed heat to the second substrate 43. Then, the heat is dissipated via the second substrate 43 into a surrounding environment of the electronic element.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a heat sink comprising:
providing a connecting member defining at least one hole passing through the connecting member, each hole comprising a first end and a second end opposite to the first end;
providing a first substrate and a second substrate each configured to conduct heat;
disposing the connecting member on the first substrate, to cause the first end of each hole to be enclosed by the first substrate;
filling each hole with a cooling medium, wherein the cooling medium is filled in each cavity by coating or injecting; the cooling medium is made of a phase change material or a material generating a phase change material under heat; the cooling medium has a volume percentage of about 15% to about 30% in each hole;
disposing the second substrate on the connecting member away from the first substrate, to cause the connecting member to be sandwiched between the first substrate and the second substrate, and the second end of each hole to be enclosed thereby forming an enclosed cavity; and
pressing the first substrate and the second substrate, with the sandwiched connecting member, to cause the first substrate, the second substrate and the connecting member to be connected to each other.

2. The method of the claim 1, wherein the connecting member comprises a supporting plate and two connecting plates; the two connecting plates are respectively disposed on two opposite surfaces of the supporting plate; each hole passes through the two connecting plates and the supporting plate; one connecting plate is sandwiched between the supporting plate and the first substrate; the other connecting plate is sandwiched between the supporting plate and the second substrate.

3. The method of the claim 2, wherein the supporting plate is made of a material selected from a group consisting of copper, aluminum, carbon steel, and silver.

4. The method of the claim 2, wherein the supporting plate comprises a supporting sheet and two copper sheets respectively defined on two opposite surfaces of the supporting sheet; one copper sheet is sandwiched between the supporting sheet and one connecting plate; the other copper sheet is sandwiched between the supporting sheet and the other connecting plate; the supporting sheet is made of an insulating material.

5. The method of the claim 2, wherein each connecting plate is a prepreg consisting of resin and reinforcement material; the reinforcement material is selected from a group consisting of glass fiber fabric, paper-base, and composite material.

6. The method of the claim 1, wherein each hole is formed by mechanical cutting, layer cutting, or punching.

7. The method of the claim 1, wherein each of the first substrate and the second substrate is made of a material selected from a group consisting of copper, aluminum, silver, and graphite.

* * * * *